United States Patent
Thrush et al.

[11] Patent Number: 6,159,831
[45] Date of Patent: Dec. 12, 2000

[54] PROCESS TO PREPARE AN ARRAY OF WIRES WITH SUBMICRON DIAMETERS

[75] Inventors: Christopher Mark Thrush, Shelby Township, Macomb County; Joseph Pierre Heremans, Troy, both of Mich.

[73] Assignees: General Motors Corporation, Detroit; Delphi Technologies Inc., Troy, both of Mich.

[21] Appl. No.: 09/166,246

[22] Filed: Oct. 5, 1998

[51] Int. Cl.[7] .......................... H01L 21/28; C30B 29/00; C30B 29/62; H01B 7/18; H01B 9/02

[52] U.S. Cl. .......................... 438/582; 438/962; 117/921; 174/105 SC

[58] Field of Search .................................... 438/962, 582; 117/921; 174/105 SC

[56] References Cited

U.S. PATENT DOCUMENTS

| | | | |
|---|---|---|---|
| 4,628,174 | 12/1986 | Anthony | 219/76.13 |
| 5,202,290 | 4/1993 | Moskovits | 437/233 |
| 5,581,031 | 12/1996 | Moskovits et al. | 257/9 |

OTHER PUBLICATIONS

Chu et al, "Design of Pores in Alumina," *Journal of Catalysis*, vol. 41, pp. 384–396 (1976).

Dresselhaus et al., "Modeling Thermoelectric Behavior in Bi Nano–Wires," XVII International Conference on Thermoelectrics, Nagoya, Japan, May 24–28, 1998.

Gurvitch, "Resistivity Anomaly in Thin Bi Wires: Possibility of a One–Dimensional Quantum Size Effect," *Journal of Low Temperature Physics*, vol. 38, Nos. 5/6, pp. 777–791 (1980).

Keller et al., "Structural Features of Oxide Coatings on Aluminum," *Journal of the Electrochemical Society*, vol. 100, No. 9, pp. 411–419, Sep. 1953.

Whitney et al., "Fabrication and Magnetic Properties of Arrays of Metallic Nanowires", Science, vol. 261, pp. 1316–1319.

Routkevitch et al., "Nonlithographic Nano–Wire Arrays: Fabrication, Physics, and Device Applications", IEEE Transactions on Electron Devices, vol. 43, pp. 1646–1658.

*Primary Examiner*—Richard Elms
*Assistant Examiner*—Adam Pyonin
*Attorney, Agent, or Firm*—George A. Grove

[57] ABSTRACT

A method is disclosed for forming an array of submicron-sized wires in a host body. In the method, the vapor of a metal, such as bismuth, is caused to flow upward through a horizontal refractory plate having many through holes, 200 nanometers or less in diameter, until all foreign material is excluded from the holes and then the plate is cooled from the top side to progressively and simultaneously condense said vapor to form said wires in the holes.

8 Claims, 3 Drawing Sheets

6,159,831

PROCESS TO PREPARE AN ARRAY OF WIRES WITH SUBMICRON DIAMETERS

TECHNICAL FIELD

This invention relates to a method of making an array of very small diameter wires. More specifically, it relates to a method of making an array of submicron diameter semiconductor wires in a host material.

BACKGROUND OF THE INVENTION

There is an interest in producing certain metals and compounds in the form of very small diameter wires (e.g., 200 nanometers or smaller) because they are expected to have useful electronic properties when in such form. For example, bulk bismuth is a semi-metal with electrons having very high mobility and a small effective mass. Theoretically, bismuth should become a semiconductor with a high thermoelectric power factor if it is prepared in the shape of single crystal wires with diameters such that the energy levels are quantized by the confinement of the electrons. The difficulty, of course, is in making such small diameter wires.

Bismuth wires, about 0.2 micrometers in diameter, have been made by pressing molten bismuth into fine Pyrex capillaries (Michael Gurevitch, "Resistivity Anomaly in Thin Bi Wires: Possibility of a One-Dimensional Quantum Size Effect," *Journal of Low Temperature Physics*, Vol. 38, Nos. 5/6, 1980). Gurevitch's method uses high pressures, and the pressure necessary scales inversely with wire diameter. Therefore, while the method is successful with 0.2 $\mu$m wires, it does not extrapolate easily to wires of smaller diameters. One can calculate that the pressure needed to force molten bismuth into a disk with 0.1 $\mu$m pores is about 200 atm, and for the disk with 0.02 $\mu$m pores, about 1000 atm are needed. After studying Gurevitch's high-pressure chamber, it was evident that this would be hard to construct and difficult to scale-up for production if a promising device ensued. Therefore, there remains a need for a practical method of producing very small diameter wires, especially wires having a diameter of 0.2 $\mu$m (200 nanometers) or smaller.

SUMMARY OF THE INVENTION

This invention provides a low cost, vapor-phase method that can produce arrays of very small diameter wires with diameters less than 200 nm. The wires can be produced as single crystals with crystallographic perfection and chemical purity sufficient to be useful in applications that require quantum size effects. The method is particularly applicable, for example, to bismuth in which quantum effects produce markedly different electrical properties than are found in the bulk material. The invention will be illustrated as applied to making an array of very small wires of bismuth in a host body of alumina.

A melt of bismuth is prepared in a cylindrical crucible within an evacuated chamber. The top of the crucible is covered with an alumina ($Al_2O_3$) disk suitably about 50 micrometers thick. The disk is formed with many holes extending from one flat major surface of the body to the other flat surface. Depending on how the disk is made, the holes may be straight or curved. The diameters of the holes are preferably substantially uniform and less than 200 nm. For example, alumina disks with straight holes of diameters of about 25 nm, 35 nm, 50 nm, 70 nm and 200 nm have been used to make wire arrays in the alumina host.

Preferably, the top of the disk is covered with a suitable, thermally-conductive plate. Bismuth vapor is caused to flow into the holes while the disk is heated to the temperature of the vapor and until the holes have been cleaned of any non-bismuth transient material. The disk is then cooled from the top surface. The cover plate is useful in promoting uniform cooling across the plate. While vapor can continue to enter the holes at the bottom of the disk, the vapor progressively condenses and freezes in each hole from the top of the disk downwardly to the inlet of the holes at the bottom of the body. Preferably, the cooling is effected so that the small wires form substantially simultaneously within the plate.

At the completion of the process, the alumina plate is removed with its included array of microscopic wires. While the wires can be removed by destruction of the plate, a wire containing host plate combination is a useful product.

The character and properties of the bismuth wires have been determined with the wires remaining in the thin, porous alumina plate. As will be shown in detail below, microscopy and electrical resistance data show that each wire is a single crystal of bismuth and that their electronic properties have been substantially and advantageously altered from the electrical properties of bulk bismuth. Bismuth wires having lengths of about 50 micrometers (50,000 nm), and diameters in the nanometer sizes stated above have been made. Bismuth wires with diameters of 50 mn and smaller were found to have a negative temperature coefficient of electrical resistance over a broad temperature range, as semiconductors do.

Alumina is a suitable host material for making bismuth wires. Alumina is inert with respect to bismuth vapor and condensate and withstands the processing temperatures. Obviously, other suitable hole-containing, electrically insulative, inert host materials may be selected for other semiconductor wire-forming guest materials. Other guest materials include, e.g., semimetals such as antimony and arsenic and semiconductors such a germanium, silicon and tin and Group III–V, II–VI and IV–VI compounds.

Other objects and advantages of the invention will become more apparent from a detailed description that follows. In the description, reference will be had to the drawings.

DESCRIPTION OF THE PREFERRED EMBODIMENT

Whatman International Limited (Maidstone, England) sells a product named ANODISC 13™ made by their ANOPORE™ technology. They are normally sold as filters and are disks made of alumina, 13 mm in diameter, 50 $\mu$m thick, with straight pores continuous from one face of the disk to the other face. The pore size is very uniform. Three pore sizes are available (0.2 μm, 0.1 μm, 0.02 μm). This invention uses this Anodisc material or like materials as a host. The subject process is used to grow very narrow, single-crystal wires inside the pores of the Anodisc. Suitable alumina disks may also be made by the method described by Chu et al., "Design of Pores in Alumina," *Journal of Catalysis*, Vol. 41, pp. 384–306 (1976), or by F. Keller, M. S. Hunter and D. L. Robinson, "Structural Features of Oxide Coatings on Aluminum," *Journal of the Electrochemical Society*, Vol. 100, pp. 411–419 (1953). Other ceramics with open pores can be substituted.

Figure 1:
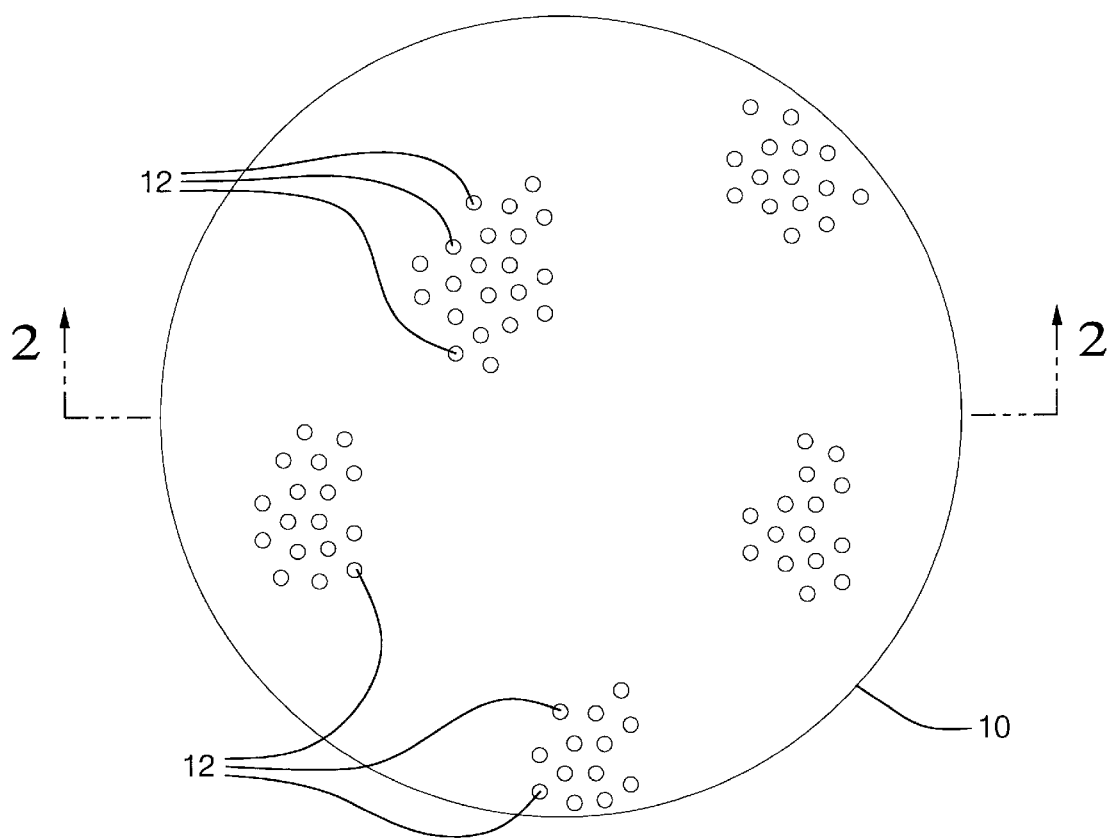
FIG. 1 is an enlarged plan view of an alumina disk with small holes or pores extending completely through the thickness of the disk. A representative disk is about 13 mm in diameter, 50 $\mu$m thick with uniform diameter holes in the range of a few nanometers to 200 nm.
Figure 2:
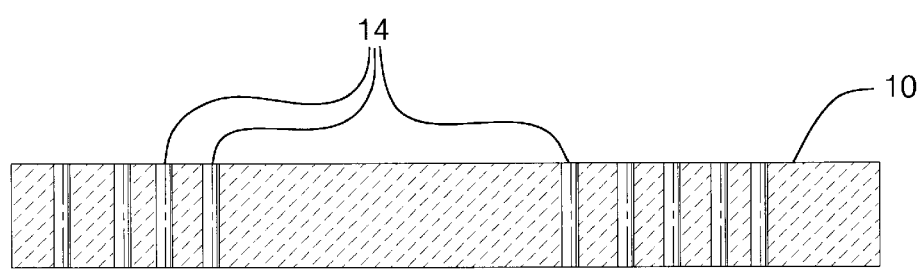
FIG. 2 is a cross-sectional view taken at 2—2 of FIG. 1. This view differs from FIG. 1 in that metal wires produced in accordance with the invention are shown in the holes.

An alumina body or disk 10 is illustrated in plan view in FIG. 1. Holes or pores 12 are shown in greatly enlarged form for illustration. As formed, the through holes are reasonably uniform in diameter in a given disk. The holes are sized to produce wires having the desired quantum-mechanical properties. Typically the diameters of the holes are in the range of about 10 to 200 nanometers. In FIG. 2, which is a section of FIG. 1, the small diameter wires 14 produced in accordance with the invention are shown. The length of the wires 14 corresponds to the thickness of the disk, e.g., about 50 micrometers, and the diameter of the wires corresponds to the diameter of the holes, e.g., 50 nanometers. Of course, only a small portion of the array of wires produced in disk 10 are visible in the sectional view of FIG. 2.

Figure 3:
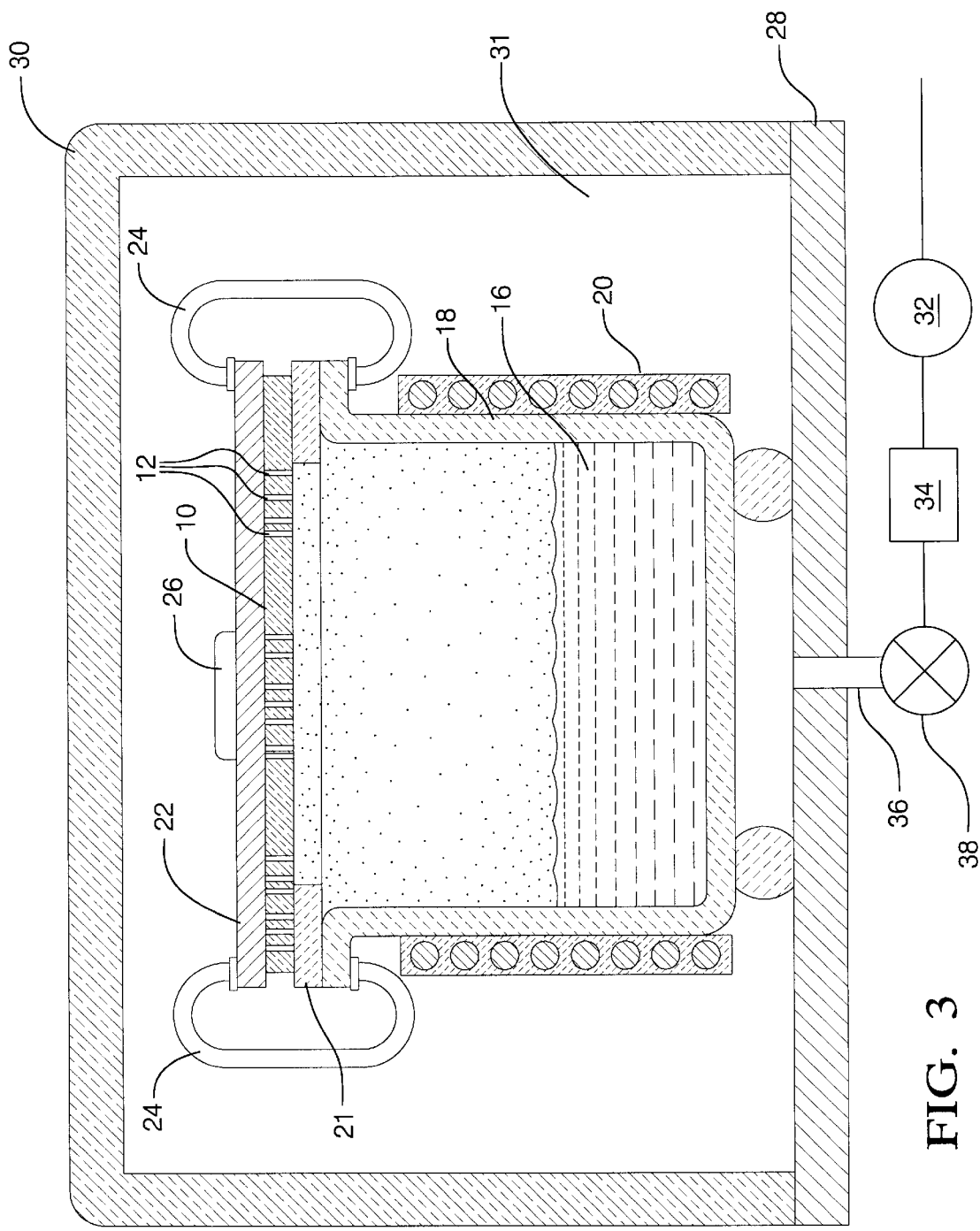
FIG. 3 is a schematic view of an apparatus useful in the practice of the invention.

A process for producing an array of small diameter bismuth wires in an alumina disk host will be described referring to FIG. 3.

Bismuth metal (99.9999% Bi) metal 16 is placed in a cylindrical alumina crucible 18 about 13 mm outside diameter OD. The crucible 18 is wrapped with an electrical resistance heating jacket 20. The heater is capable of heating the crucible and its contents to a temperature of about 650° C. to generate bismuth vapor. The top of crucible 18 is covered with an alumina disk (Anodisc) 10 with its holes 12 like the disk depicted in FIG. 1. In the event that the disk 10 is smaller in diameter than the crucible 18, a suitable support plate 21 may be interposed to support the disk 10.

A nonsticking molybdenum (or, e.g., graphite) backing plate 22, 13 mm in diameter and 0.5 mm thick, is placed on top of the disk 10. As will be seen, backing plate 22 serves several purposes in the practice of the process. Tungsten clips 24 hold the disk 10, support plate 21 and backing plate 22 in place on the upper lip of crucible 18. A small piece of bismuth 26 placed on top of the cover plate 22 serves as a temperature indicator.

The crucible 18, electric heater 20, disk 10, etc., were all placed on a metal base plate 28 and covered with a bell jar 30 to define an evacuatable chamber 31. Chamber 31 was evacuated through port 36 and valve 38 to a pressure of about $10^{-6}$ torr using vacuum pump 32 and liquid nitrogen trap 34.

Heater 20 was then activated (through electrical leads not shown) to melt the bismuth metal 16 and generate bismuth vapor in crucible 18. In the first stage of heating, the bismuth vapor condenses on the bottom of the otherwise unheated disk 10 and forms droplets. As heating continues, radiation from heating jacket 20 and the refluxing vapor-condensate heats the disk 10 and the backing plate 22 to a temperature where bismuth vapor penetrates into the holes 12 of the disk and condenses on the bottom of the cover plate 22. The heating of the crucible with heater 20 is continued. In this embodiment of the invention, the disk 10 and the backing plate 22 are not cooled apart from their radiation loss to the chamber wall. Finally, uncondensed bismuth vapor permeates holes of the disk to the bottom of the cover plate. The contact between the plate 22 and the disk 10 is not vapor-tight, so that bismuth vapor that has traversed the holes in disk 10 is released into vacuum chamber 31. The cover plate 24 becomes hot enough to vaporize the bismuth particle 26 on the top of the cover plate. Operation in this regime is used to clean the host material of impurities. A slow cool-down phase is now needed to obtain thin wires of bismuth in the pores 12 of the disk 10 (i.e., the Anodisc).

When the small piece of bismuth 26 has evaporated, the power to heater 20 is shut off to permit slow cooling of the cover plate 22 and alumina disk 10. In this relatively small scale embodiment, cooling is achieved simply by heat loss through the walls of bell jar 30 and by the evaporation of any remaining bismuth particle 26. Obviously, controlled cooling means could be incorporated into the apparatus.

Cooling is managed so that bismuth condenses and solidifies at the top side of the disk 10 first. The cover plate 22 promotes more or less uniform cooling across the upper surface of the disk. The cool down proceeds from the top side of the alumina disk toward the bottom side because the only heat source is the heated crucible. Because of the directional cooling and the very small solidification space in the holes of the alumina body, single crystal wires of bismuth grow in the holes from the top side of the body downwards. Once the bottom side of the disk 10 has reached a temperature below about 271° C., where bismuth is solid, the wire-making step is finished. The chamber 31 is then carefully backfilled with nitrogen and the array of very small bismuth wires is recovered in the host alumina body.

The cover plate 22 served several purposes. Although it was not intended to form a tight seal against the alumina disk 10, the cover plate 22 largely confined the bismuth vapor below the plate in the holes 12 of the porous disk 10. The cover plate 22 which was as massive as the alumina disk served to slow the heating and cooling rate of the alumina body. During cooling, the presence of the unheated disk (which could have been provided with its own cooling means) acted as a heat sink closure to keep the vapor in the holes of the alumina and effect the desired directional solidification of the bismuth.

In this relatively small scale embodiment, the total time from heat up to the end of the controlled cool down is approximately 15 minutes, once the chamber had achieved its base low pressure. Droplet formation takes place in the first three minutes, the sample warming to the temperature where bismuth re-evaporates (500–600° C.) takes another two minutes, bismuth totally evaporating from the top of backing plate takes an additional two minutes, and lastly, the current to the oven is slowly reduced to zero in approximately eight minutes. The study of the different stages of the formation of bismuth wires described above was conducted by halting the process at the various stages and analyzing the results under a microscope.

Visual observation established that the bismuth vapor had penetrated totally through the porous disk 10. A carbon black-like color at the top side of the porous disk 10 revealed the top ends of the wires in the array. When the disk was cleaved and the cross-section viewed, black wire streaks from the top to the bottom of the disk were clearly visible with an optical microscope.

Scanning electron microscopy (SEM) was performed on cleaved Anodisc material containing bismuth wires. The SEM images of 100 nm disk bodies revealed faceted heads of the bismuth wires emerging from the top disk surface. These facets are characteristic of single-crystal bismuth and form in the direction normal to the trigonal axis. The process was repeated on many Anodiscs and many other porous alumina disk samples.

In order to provide bismuth nanowires for further evaluation of the electronic properties of the wires, a series of samples was prepared in porous alumina host materials with pore diameters ranging from about 25 nm to 200 nm by the vapor phase technique described above. The host material was porous amorphous alumina prepared by anodic oxidation of alumina. The flat plates of alumina were employed either in the form of rectangles 5 mm by 10 mm by about 50 micrometers thick or in the form of disks as described above. An array of many holes traverses the plate from one side to the other as illustrated in FIGS. 1 and 2. The five different alumina plates with their different hole sizes are summarized below in the table.

| Sample | Average Wire Diameter (nm) | Average Spacing Between Wires (nm) |
|---|---|---|
| J1 | 70 ± 10 | 160 |
| J2 | 36 ± 5 | 75 |
| J4 | 48 ± 6 | 116 ± 6 |
| J5 | 28 ± 3 | 45 ± 4 |
| W9 and W11 | 200 | 400 |

Figure 4:
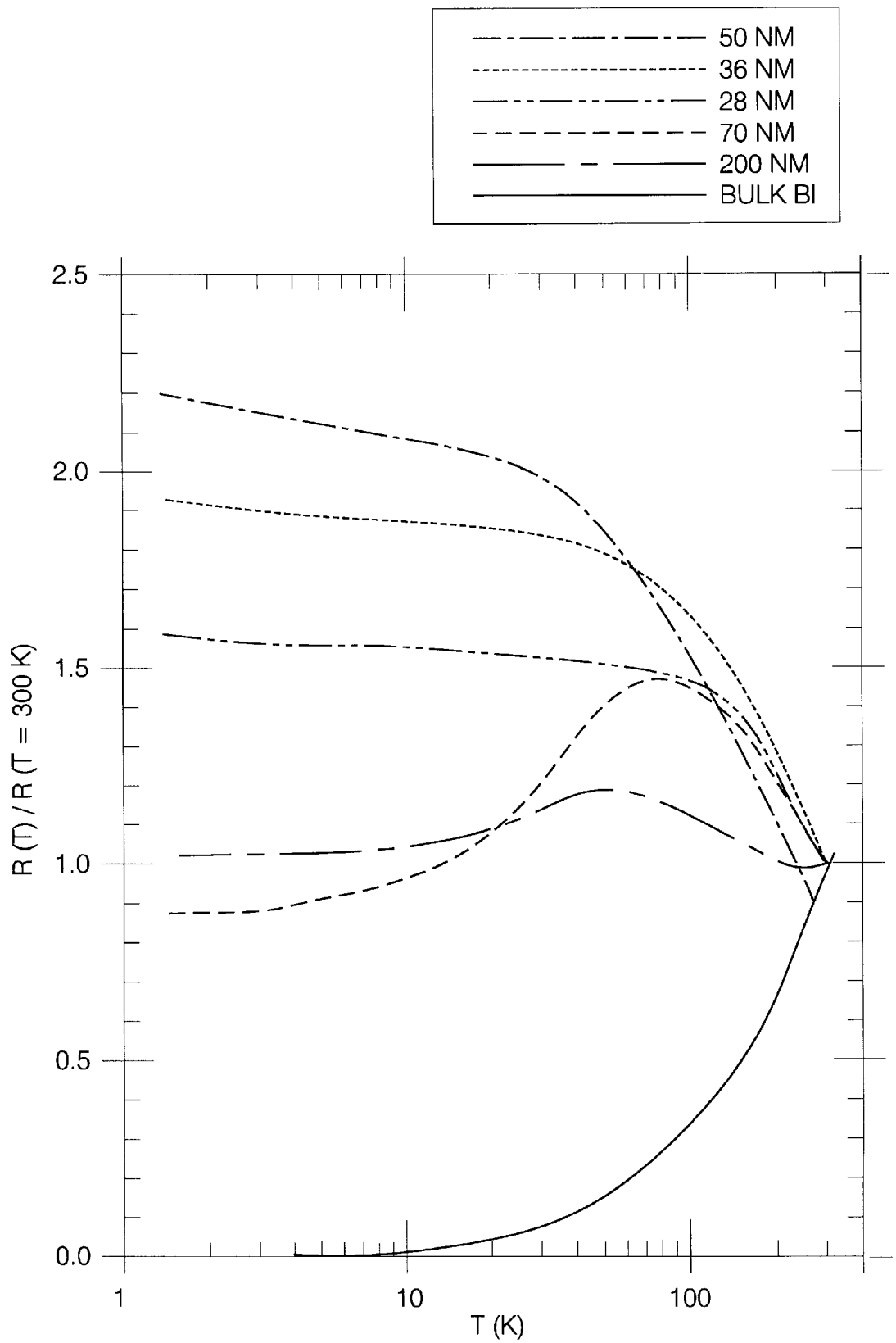
FIG. 4 is a graph of the electrical resistance of bismuth wires of 200 nm, 70 nm, 50 nm, 36 nm and 28 nm diameters as a function of temperature. The resistance values are normalized to the resistances at 300K. The resistance of bulk bismuth over the same range is plotted for comparison.

The electrical resistance of the respective arrays of bismuth wires in the alumina hosts was measured. These resistance values were obtained from liquid helium temperatures essentially up to 300° K., about room temperature. The data for the bulk bismuth and for the respective sizes of bismuth wire arrays in the alumina hosts are presented in FIG. 4.

The resistance values of the samples at each temperature were normalized by dividing the value at each temperature with the value of the resistance for the sample at T=300° K. It is seen that the resistance of bulk bismuth increases from 4° K. to room temperature. The resistance values for the 200 nm diameter bismuth wires and the 70 nm bismuth wires likewise increase from low temperatures to about liquid nitrogen temperatures and thereafter the normalized resistances decrease. However, it is clearly seen that the normalized resistances for the 50 nm, 36 nm and 28 nm diameter wires decrease over the range from the lowest measured values to room temperature. These characteristics of these 50 nm diameter wires and smaller correspond to the characteristics of semiconductor materials.

Besides having the characteristics of semiconductors, the small diameter bismuth nanowires arrays are calculated by G. Dresselhaus et al, "Modeling Thermoelectric Behavior in Bi Nano-wires," a paper given at the XVII International Conference of Thermoelectrics, May 24–28, 1998, Nagoya, Japan, to have excellent thermoelectric properties. It is clearly possible that a porous alumina host such as that depicted in FIG. 2 with nanometer diameter bismuth wires could be employed in a thermoelectric cooling element. The array of wires in porous alumina would be provided with a suitable metal current injector on each of the top and bottom surfaces and a d.c. current force provided to pass a current through the array of small wires. The passage of the current would result in one surface of the array becoming cold with the heat being ejected from the other surface. Suitable heat exchanger members would be provided to the surfaces.

In summary, microscopy and electrical resistance data consistently point to the single crystal nature and the high electronic quality of bismuth wires prepared by the method claimed in this invention. This proves that such a method is promising for the preparation of large quantities of semiconductor or semimetal wires with dimensions small enough, and a crystallographic quality and chemical purity high enough, to display quantum effects.

The method that has been described is of general application. It may also be used to convert semi-metal guest materials such as antimony, arsenic and bismuth into small diameter, straight or curved semiconductor wires. The process may also be used to convert semiconductor materials such as silicon, germanium, tin, Group III–V compounds, Group II–VI compounds and Group IV–VI compounds into such wires. The host material, which like alumina is an electrical insulator, is to be chemically compatible with the guest material and sufficiently refractory to withstand process temperatures. Examples of host materials, in addition to alumina, include Vycor glass (Dow Corning) and aluminum nitride.

While this invention has been described in terms of some specific embodiments, it will be appreciated that other forms can readily be adapted by one skilled in the art. Accordingly, the scope of this invention is to be considered limited only by the following claims.

What is claimed is:

1. A method of forming an array of wires having diameters of about 200 nanometers or less, said method comprising:

flowing vapor into a body having a plurality of holes extending through said body from a vapor inlet side to a vapor outlet side, the diameter of said holes being about 200 nanometers or less, and cooling said body from the vapor outlet side to progressively condense said vapor in said holes in the direction from said outlet side to said inlet to progressively and simultaneously form said wires in the holes.

2. A method of forming an array of semiconductor wires having diameters of about 200 nanometers or less, said method comprising:

flowing vapor of the composition of said semiconductor into a host body having a plurality of holes extending through said body from a vapor inlet side to a vapor outlet side, the diameter of said holes being about 200 nanometers or less, and cooling said body from the vapor outlet side to progressively condense said vapor in said holes in the direction from said outlet side to said inlet to progressively and simultaneously form said wires in the holes.

3. A method as recited in claim 2 wherein said host body is a refractory material.

4. A method as recited in claim 2 wherein said host body is a ceramic material.

5. A method as recited in claim 2 in which said host body is alumina.

6. A method as recited in claim 2 in which said composition is a semimetal selected from the group consisting of bismuth, antimony and arsenic.

7. A method as recited in claim 2 in which said composition is a semiconductor selected from the group consisting of silicon, germanium, tin, Group III–V compounds, Group II–VI compounds and Group IV–VI compounds.

8. A method of forming an array of semiconductor wires having diameters of about 200 nanometers or less, said method comprising:

flowing bismuth vapor into a refractory body having a plurality of holes extending through said body from a vapor inlet side to a vapor outlet side, the diameter of said holes being about 200 nanometers or less, continuing the flow of said vapor to fill the holes of said body with said vapor, and cooling said body from the vapor outlet side to progressively condense said vapor in said holes in the direction from said outlet side to said inlet to progressively and simultaneously form single crystal bismuth wires in the holes.

* * * * *